UNIJUNCTION TRANSISTOR WITH IMPROVED EFFICIENCY AND HEAT TRANSFER CHARACTERISTICS

Filed Feb. 15, 1966

INVENTOR.
JOHN M. GAULT

BY
OSTROLENK, FABER, GERB & SOFFEN
ATTORNEYS

United States Patent Office 3,423,652

Patented Jan. 21, 1969

3,423,652

UNIJUNCTION TRANSISTOR WITH IMPROVED EFFICIENCY AND HEAT TRANSFER CHARACTERISTICS

John M. Gault, Manhattan Beach, Calif., assignor to International Rectifier Corporation, El Segundo, Calif., a corporation of California Filed Feb. 15, 1966, Ser. No. 527,583

U.S. Cl. 317—235 2 Claims

Int. Cl. H01l 11/00

ABSTRACT OF THE DISCLOSURE

A unijunction transistor in which two N+ base regions are spaced from one another on the upper surface of an N-type silicon wafer. A crescent-shaped P-type emitter region partially surrounds one of the bases which is centrally located, while a second generally arcuate P-type region surrounds the crescent-shaped region and central base region to improve the collection of minority carriers. A lower P-N junction is formed parallel to the bottom surface of the wafer and the bottom of the wafer is provided with an electrode adapted for mounting to a heat sink.

This invention relates to a unijunction transistor structure, and more particularly relates to a novel unijunction transistor structure which simplifies the fabrication of the device and improves its electrical characteristics.

Unijunction transistors are well known to the art. The configuration of their various N and P regions and electrodes are such that it becomes difficult to fabricate the devices. Moreover, in the presently used design, the collection of minority carriers injected from the emitter junction is relatively inefficient because of the presently used geometry.

The present invention provides a new and novel geometry for a unijunction transistor which acts both to simplify the fabrication of the device and to increase the collection efficiency of minority carriers injected from the emitter, thereby to lower the saturation voltage for the device. Moreover, with the novel structure of the invention, the entire bottom surface of the device is of the same conductivity type, and can, therefore, be directly connected to a conductive heat sink.

Accordingly, a primary object of this invention is to provide a novel configuration for unijunction transistors which is simpler to fabricate than that presently used.

Yet another object of this invention is to provide a novel unijunction transistor construction which has improved electrical characteristics.

A further object of this invention is to provide a novel unijunction transistor which has a low saturation voltage.

Still another object of this invention is to provide a novel unijunction transistor which can have one full surface thereof mounted on a heat sink.

These and other objects of this invention will become apparent from the following description when taken in connection with the drawings, in which.

Figure 1:
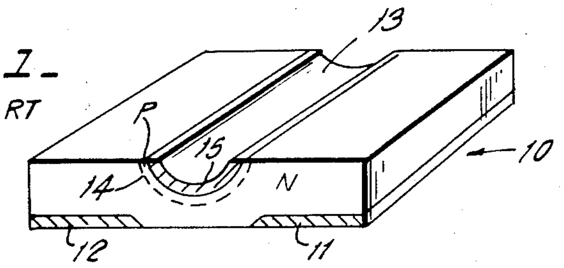
FIG. 1 PRIOR ART
FIGURE 1 shows a cross-sectional view of a typical silicon chip adapted for use as a unijunction transistor, as used in the prior art.

Referring first to FIGURE 1 which shows the typical prior art device, there is commonly provided a body 10 of N-type silicon in a chip or wafer of silicon where the body 10 is provided with two spaced ohmic contacts 11 and 12 at the bottom thereof, which serve as the respective ohmic contacts for bases 1 and 2. Body 10 is then provided with a grove 13 in the upper surface thereof, the walls of which are rendered to have the P-type conductivity, thereby to create the P-N junction 14, and an ohmic contact 15 is then made to the P-type interior surface of groove 13.

Figure 2:
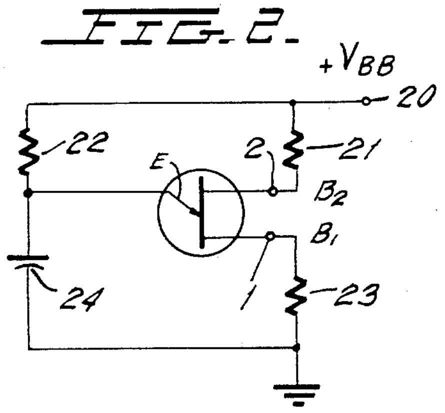
FIGURE 2 shows a typical circuit diagram using the unijunction transistor of FIGURE 1.

The unijunction transistor of FIGURE 1 is commonly connected in a circuit, as shown in FIGURE 2, where the emitter electrode E is connected to electrode 13 of FIGURE 1, while the base 1 and base 2 electrodes $B_1$ and $B_2$, respectively, are connected to electrodes 11 and 12, respectively, of FIGURE 1.

A source of positive voltage, shown as $V_{BB}$ is connected to terminal 20 and to base $B_2$ through resistor 21 and to the emitter E through the resistor 22. Base electrode $B_1$ is then connected to ground through resistor 23, and the end of resistor 23 is connected through capacitor 24 to the emitter electrode.

Figure 3:
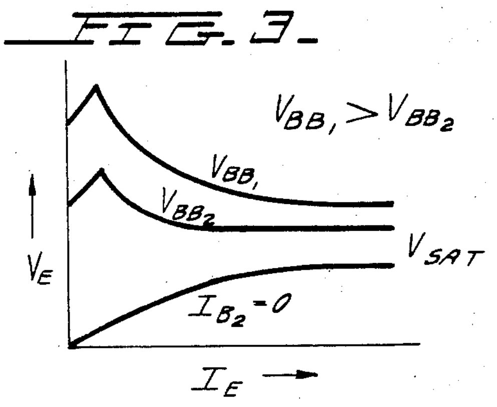
FIGURE 3 shows the emitter voltage and current characteristics for the unijunction transistor of FIGURES 1 and 2.

When connected in this manner, the device will exhibit the emitter current-voltage characteristics shown in FIGURE 3 for different base voltages, with FIGURE 3 clearly illustrating the saturation voltage characteristics of the device for increasing emitter current $I_E$.

Thus, in FIGURES 2 and 3, and when a positive bias is placed on base $B_2$ with respect to base $B_1$, the emitter junction will be reverse biased and only leakage current will flow through the emitter. As capacitor 24 is charged through resistor 22, the reverse bias on the emitter junction will decrease to zero, and the junction thereafter becomes forward biased. At this point, emitter current $I_E$ flows through the emitter to base $B_1$.

This injection of holes from the emitter into the N-type silicon body 10 of FIGURE 1 results in conductivity modulation of the N-type region 10, reducing the resistance between the emitter and base $B_1$ and reducing the resistance between base $B_1$ and base $B_2$. The combination of these effects results in a sharp output pulse at base $B_1$ which makes the device suitable for its usual application of firing a controlled rectifier, or in other applications requiring the generation of sharp pulses.

Since the injection of minority carriers from the emitter junction 14 varies in a random manner, many of these minority carriers will recombine with majority carriers in the silicon body 10 or at the surface of the wafer 10. This has the effect of maintaining a higher saturation voltage than would exist if more efficient collection of these minority carriers by base $B_1$ could be achieved. Moreover, since base $B_1$ and base $B_2$ and the emitter must all be electrically isolated, when following the typical prior art construction of FIGURE 1, it becomes difficult to construct an efficient heat sink for the device.

Figure 4:
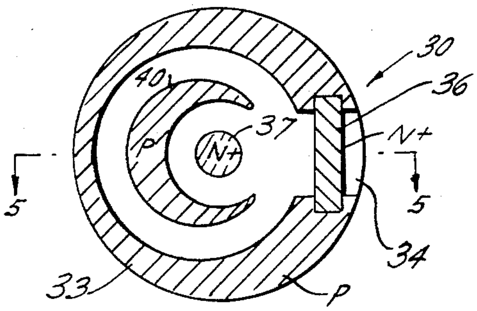
FIGURE 4 is a top view of a unijunction transistor configuration constructed in accordance with the present invention.
Figure 5:
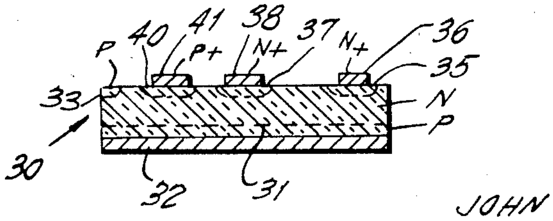
FIGURE 5 is a cross-sectional view of the unijunction transistor of FIGURE 4 taken across the line 5—5 in FIGURE 4.

In accordance with the present invention, the geometry of the device is changed, as illustrated in FIGURES 4 and 5, to permit the use of lower saturation voltages and to permit the device to be mounted directly upon a heat sink by rendering the complete lower surface of the device a common electrode.

Referring now to FIGURES 4 and 5, I have illustrated therein a circular wafer 30 of N-type silicon material which has a lower P-type junction 31 formed therein and which receives a bottom electrode 32 which can be soldered directly to a heat sink.

The upper surface of the device is then prepared to have a first crescent-shaped P-type zone 33 therein which has a gap 34, as shown in FIGURE 4. This P-type zone 33 is shown for convenience in cross-hatching in FIGURE 4. The first base is then formed of an N+ region 35 which extends across the gap 34, as shown, and receives an electrode 36, as shown in FIGURE 5. Base $B_2$ is then formed by a circular centrally located N+ region 37 which receives an electrode 38, as shown in FIGURE 5. Finally, the emitter is formed of the crescent-shaped P-type region 40 which receives the emitter electrode 41 in FIGURE 5.

It will be noted that the P-N junction formed in the lower surface of the device shown in FIGURE 5 by P-type region 31 will isolate the device electrically from the heat sink to which it is mounted, but will not thermally isolate the device. Note that in normal operation the base should float slightly positive with respect to the device. Note that if an even greater improvement in collection efficiency is desired electrode 32 can be connected to electrode 36 in which case region 31 will also act as a collector of minority carriers for base 1.

When the device of FIGURES 4 and 5 is now connected in the circuit of FIGURE 1, the emitter 40 will initially be reverse biased. As capacitor 24 charges through resistor 22, this bias will go to zero and will then become a forward bias. Holes will then be injected from the emitter crescent 40 into the N-type material of the body, resulting in conductivity modulation which, in turn, reduces the resistance between base 37 and base 35 and the resistance between the emitter 40 and base 35.

Since these injected holes diffuse in a random manner through the N-type material, the auxiliary base $B_1$ collector region 33, which is shorted to base 35, will more efficiently collect these holes, resulting in a lower saturation voltage. This, in turn, will result in a better peak-to-valley ratio and in a steeper nagative slope in the firing curve of FIGURE 3.

In the manufacture of the device, standard diffusion and washing techniques can be used which will be readily understood to those skilled in the art. It will be further understood that the conductivity types selected to describe the device in FIGURES 4 and 5 could be reversed.

A successful device has been constructed with the following dimensions:

| | | |
|---|---|---|
| Wafer thickness | inch | .008 |
| Junction depths | do | .001 |
| Chip diameter | do | .080 |
| Resistivity | cm | 100Ω |

The device was produced by using oxide masking and photo resist techniques.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. A unijunction transistor comprising:

(a) a wafer of N-type silicon having an upper and lower surface;

(b) a central N+ region formed in said upper surface of said wafer;

(c) an arcuate-shaped P-type surface region formed in said upper surface of said wafer partially surrounding and radially spaced from said central N+ region and defining an emitter junction within said N-type wafer;

(d) a second N+ region formed in said upper surface of said wafer and laterally displaced from said central N+ region with said central N+ region disposed between said second N+ region and said arcuate P-type region;

(e) an emitter electrode, a first base electrode and a second base electrode connected to said arcuate P-type region, said second N+ region and said central N+ region, respectively;

(f) conductive means extending across said bottom surface of said wafer for mounting said wafer on a heat sink;

(g) and a second arcuate P-type region in said upper surface extending around and spaced from said central N+ region and said arcuate P-type region; the ends of said second P-type region merging into opposite sides of said second N+ region.

2. The device of claim 1 which further includes a P-type region extending across the said bottom surface of said N-type wafer.

References Cited

UNITED STATES PATENTS

| | | | |
|---|---|---|---|
| 2,938,130 | 5/1960 | Noll | 307—88.5 |
| 3,325,705 | 6/1967 | Clark | 317—235 |

JOHN W. HUCKERT, *Primary Examiner.*

R. J. SANDLER, *Assistant Examiner.*